(12) United States Patent
Tsai

(10) Patent No.: US 12,245,423 B2
(45) Date of Patent: Mar. 4, 2025

(54) SEMICONDUCTOR DEVICE WITH CONDUCTIVE CAP LAYER OVER CONDUCTIVE PLUG AND METHOD FOR PREPARINGING THE SAME

(71) Applicant: NANYA TECHNOLOGY CORPORATION, New Taipei (TW)

(72) Inventor: Hung-Chi Tsai, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/234,029

(22) Filed: Aug. 15, 2023

(65) Prior Publication Data

US 2023/0403847 A1    Dec. 14, 2023

Related U.S. Application Data

(60) Continuation-in-part of application No. 17/245,727, filed on Apr. 30, 2021, now Pat. No. 11,778,812, which is a division of application No. 16/422,608, filed on May 24, 2019, now Pat. No. 11,114,444.

(51) Int. Cl.
  *H10B 12/00*    (2023.01)
(52) U.S. Cl.
  CPC .......... *H10B 12/485* (2023.02); *H10B 12/30* (2023.02); *H10B 12/482* (2023.02); *H10B 12/488* (2023.02)
(58) Field of Classification Search
  None
  See application file for complete search history.

(56) References Cited

U.S. PATENT DOCUMENTS

| | | |
|---|---|---|
| 5,698,869 A | 12/1997 | Yoshimi et al. |
| 6,150,689 A | 11/2000 | Narui et al. |
| 6,235,572 B1 | 5/2001 | Kunitomo et al. |

(Continued)

FOREIGN PATENT DOCUMENTS

| | | |
|---|---|---|
| CN | 101527278 A | 9/2009 |
| TW | 201715702 A | 5/2017 |

OTHER PUBLICATIONS

Office Action and search report mailed on Sep. 5, 2024 related to U.S. Appl. No. 18/509,601.

(Continued)

*Primary Examiner* — Sarah K Salerno
(74) *Attorney, Agent, or Firm* — Xuan Zhang

(57) ABSTRACT

The present disclosure relates to a semiconductor device including a semiconductor substrate, word lines, mask layers, spacers, a conductive plug, a conductive cap layer, and a dielectric layer. The word lines are disposed over the semiconductor substrate. The mask layers are disposed over the plurality of word line, respectively. The spacers are disposed over opposite sidewalls of the word lines and opposite sidewalls of the mask layers, respectively. The conductive plug is disposed between the word lines. The conductive cap layer is disposed over the conductive plug. The dielectric layer is disposed over the word lines and the spacers. Each of the spacers includes an inner spacer, an outer spacer, and an air gap. The inner spacer is in contact with the respective word line and the respective mask layer. The air gap is disposed between the inner spacer and the outer spacer.

20 Claims, 17 Drawing Sheets

(56) References Cited

U.S. PATENT DOCUMENTS

| | | |
|---|---|---|
| 8,581,337 B2 | 11/2013 | Kye et al. |
| 2001/0005624 A1 | 6/2001 | Aoyagi et al. |
| 2001/0010402 A1 | 8/2001 | Matsuki et al. |
| 2001/0029113 A1 | 10/2001 | Kunitomo et al. |
| 2002/0151134 A1 | 10/2002 | Kunikiyo |
| 2003/0216001 A1 | 11/2003 | Lee et al. |
| 2007/0275548 A1* | 11/2007 | Lavoie et al. |
| 2014/0187037 A1* | 7/2014 | Rho .................. H10B 12/0335 438/626 |
| 2021/0343721 A1 | 11/2021 | Lin |
| 2022/0223684 A1* | 7/2022 | Tsai ....................... B82Y 10/00 |
| 2022/0254889 A1* | 8/2022 | Hossain ............. H01L 29/0657 |
| 2022/0254899 A1 | 8/2022 | Huang |

OTHER PUBLICATIONS

Office Action and search report mailed on Oct. 18, 2024 related to U.S. Appl. No. 18/509,601.
English translation of Abstract of CN 101527278 A, 2008.
English translation of Abstract of TW 201715702A, 2017.

* cited by examiner

SEMICONDUCTOR DEVICE WITH CONDUCTIVE CAP LAYER OVER CONDUCTIVE PLUG AND METHOD FOR PREPARINGING THE SAME

CROSS-REFERENCE TO RELATED APPLICATION

This application is a continuation-in-part application of U.S. Non-Provisional application Ser. No. 17/245,727 filed Apr. 30, 2021, which is a divisional application of U.S. Non-Provisional application Ser. No. 16/422,608 filed May 24, 2019. Those are incorporated herein by reference in their entireties.

TECHNICAL FIELD

The present disclosure relates to a method for forming a semiconductor device, and more particularly, to a method for forming a semiconductor device with a conductive cap layer over a conductive plug.

DISCUSSION OF THE BACKGROUND

Due to structural simplicity, dynamic random access memories (DRAMs) can provide more memory cells per unit of chip area than other types of memories, such as static random access memories (SRAMs). A DRAM is comprised of a plurality of DRAM cells, each of which includes a capacitor for storing information and a transistor coupled to the capacitor for regulating the timing of when the capacitor is charged or discharged. During a read operation, a word line (WL) is asserted, turning on the transistor. The enabled transistor allows the voltage across the capacitor to be read by a sense amplifier through a bit line (BL). During a write operation, the data to be written is provided on the BL when the WL is asserted.

To satisfy the demand for ever-greater amounts of memory storage, the dimensions of the DRAM memory cells have continuously been reduced, and as a result, the packing densities of the DRAMs have increased considerably. Thus, as the dimensions of the transistors and capacitors have become smaller, the line widths of WLs and BLs have also become smaller and distances between adjacent pairs of BLs or WLs have decreased as well. In a conventional DRAM design, due to a BL contact plug connecting the BL and a drain region, with the BL disposed on top of the BL contact plug, formation of the BL contact plug usually takes place before formation of the BL. A problem may arise, however, when the BL and the BL contact plug are not properly aligned. Significantly, the likelihood of such problem increases as feature sizes of the DRAM memory cell is reduced.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a semiconductor substrate, word lines, mask layers, spacers, a conductive plug, a conductive cap layer, and a dielectric layer. The word lines are disposed over the semiconductor substrate. The mask layers are disposed over the plurality of word line, respectively. The spacers are disposed over opposite sidewalls of the word lines and opposite sidewalls of the mask layers, respectively. The conductive plug is disposed between the word lines. The conductive cap layer is disposed over the conductive plug. The dielectric layer is disposed over the word lines and the spacers. Each of the spacers includes an inner spacer, an outer spacer, and an air gap. The inner spacer is in contact with the respective word line and the respective mask layer. The air gap is disposed between the inner spacer and the outer spacer.

In one embodiment of the present disclosure, a method for forming a semiconductor device is provided. The method includes: forming word lines over a semiconductor substrate; forming mask layers over the word lines, respectively; forming spacers over opposite sidewalls of the word lines and opposite sidewalls of the mask layers, respectively; forming a dielectric layer covering the word lines; forming a conductive plug between the word lines, wherein the conductive plug is surrounded by the dielectric layer; removing a portion of the dielectric layer to partially expose a sidewall surface of the conductive plug; and forming a conductive cap layer covering a top surface and the sidewall surface of the conductive plug. The step of forming the spacers includes: forming inner spacers in contact with the word lines; forming sacrificial spacers in contact with the inner spacers, respectively; forming outer spacers in contact with the sacrificial spacers, respectively; and removing the sacrificial spacers.

Embodiments of a semiconductor device are provided in accordance with some embodiments of the disclosure. The semiconductor device includes a conductive cap layer disposed between a conductive plug and a bit line, and a top surface and a portion of a sidewall surface of the conductive plug are covered by the conductive cap layer. Therefore, a width of the top surface of the conductive cap layer is greater than a width of the top surface of the conductive plug. As a result, issues of misalignment between the conductive cap layer and a contact via of the bit line, which is formed over the conductive cap layer during subsequent processes, may be prevented or reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
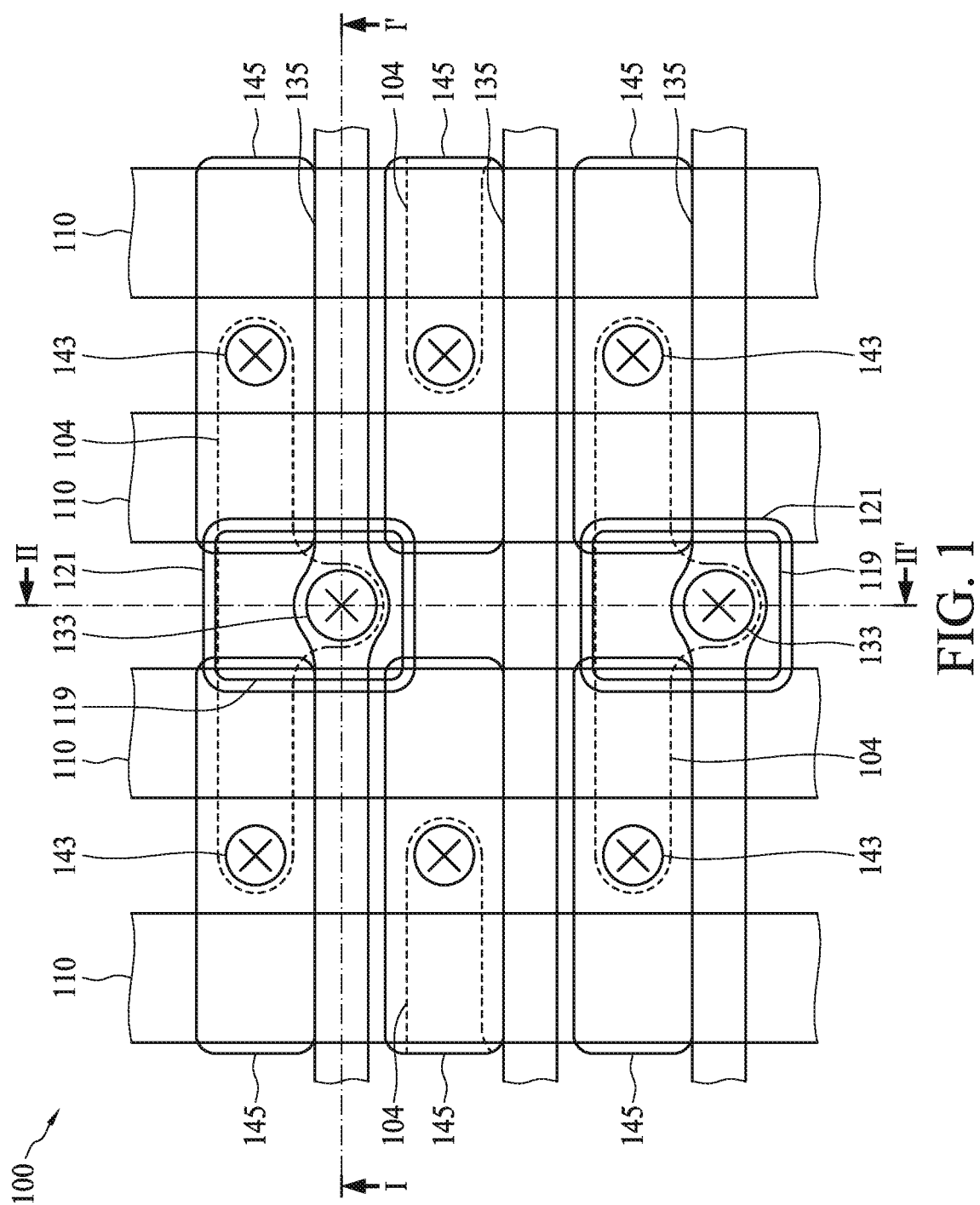
FIG. 1 is a layout illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
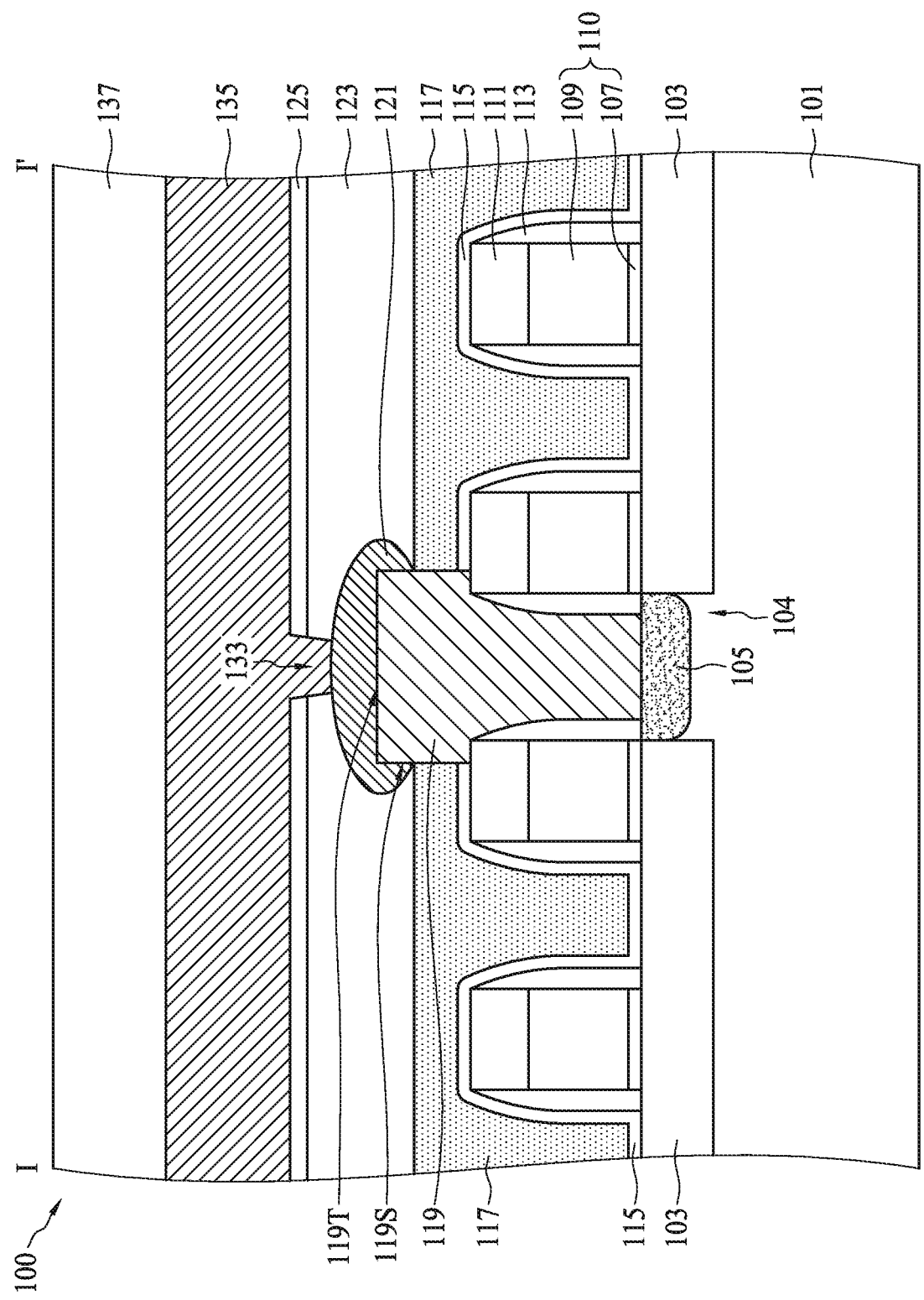
FIG. 2 is a cross-sectional view illustrating the semiconductor device along a sectional line I-I' in FIG. 1, in accordance with some embodiments.
Figure 3:
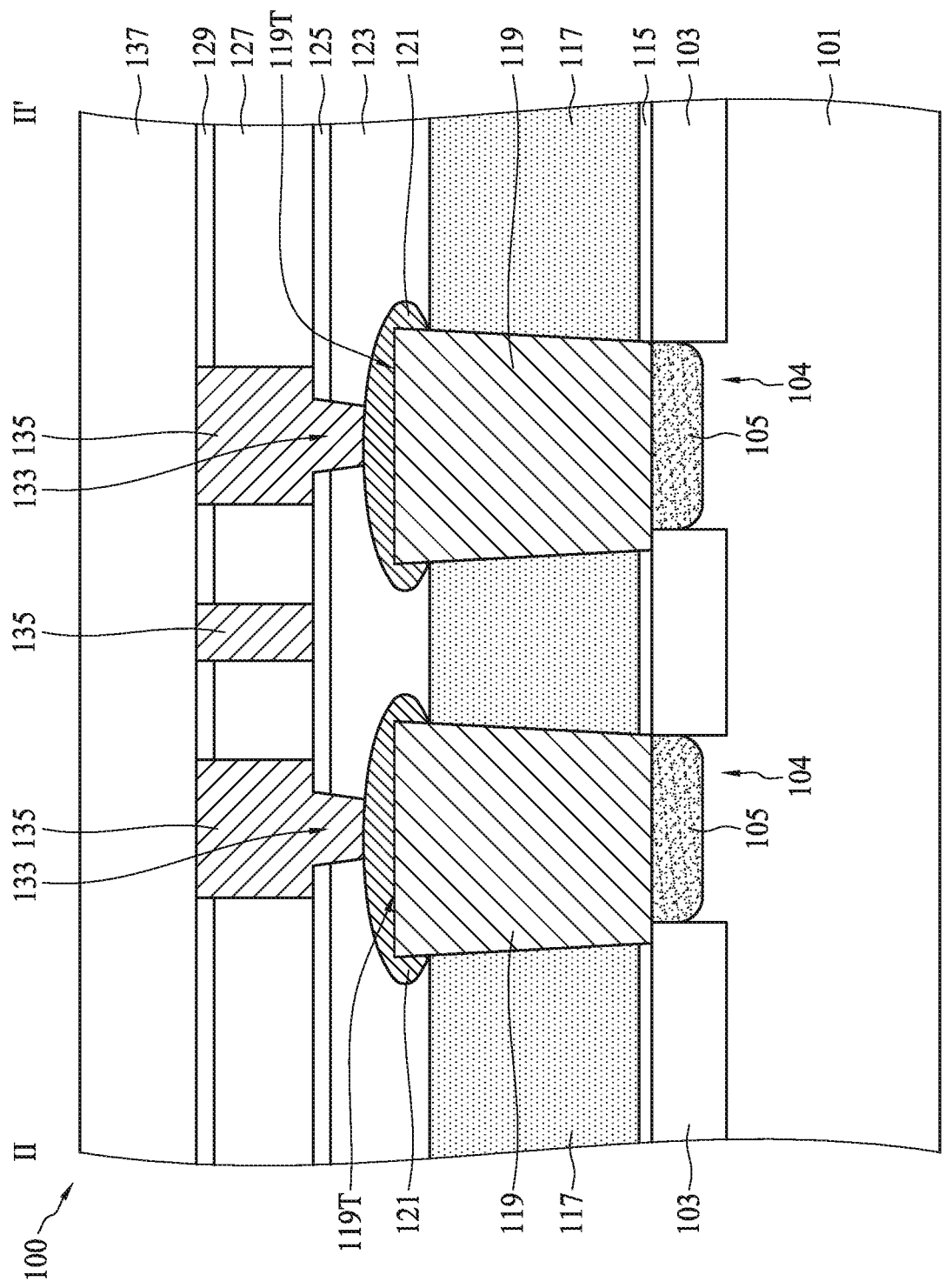
FIG. 3 is a cross-sectional view illustrating the semiconductor device along a sectional line II-II' in FIG. 1, in accordance with some embodiments.

FIG. 1 is a layout illustrating a semiconductor device 100, in accordance with some embodiments. As shown in FIG. 1, the semiconductor device 100 includes a plurality of active regions 104. In some embodiments, the active regions 104 are regions in the semiconductor substrate 101 which are defined by isolation structures 103, and the active regions 104 include source/drain (S/D) regions 105 (the semiconductor substrate 101, the isolation structure 103 and the S/D regions 105 are shown in FIGS. 2 and 3). Moreover, although each of the active regions 104 of FIG. 1 has a T-shaped profile, the profiles and arrangements of the active regions 104 may be changed according to actual application.

Moreover, the semiconductor device 100 also includes a plurality of word lines 110 (i.e., gate structures) and a plurality of bit lines 135, as shown in FIG. 1 in accordance with some embodiments. The word lines 110 are parallel to each other, the bit lines 135 are parallel to each other, and the word lines 110 are arranged perpendicular to the bit lines 135. In some embodiments, the semiconductor device 100 further includes a plurality of conductive plugs 119, a plurality of conductive cap layers 121, and a plurality of conductive vias 133. The bit lines 135 are electrically connected to the underlying S/D regions 105 in the active regions 104 through the conductive vias 133, the conductive cap layers 121 and the conductive plugs 119.

In addition, the semiconductor device 100 also includes a plurality of storage nodes 145 and a plurality of conductive vias 143, as shown in FIG. 1 in accordance with some embodiments. The storage nodes 145 are electrically connected to the underlying S/D regions 105 in the active regions 104 through the conductive vias 143. It should be noted that, in some embodiments, other conductive structures (e.g., conductive plugs, conductive pads, conductive lines, etc.) may be formed between the storage nodes 145 and the underlying S/D regions 105 to provide electrical connections. In some embodiments, the semiconductor device 100 is a dynamic random access memory (DRAM).

FIG. 2 is a cross-sectional view illustrating the semiconductor device 100 along the sectional line I-I' in FIG. 1, and FIG. 3 is a cross-sectional view illustrating the semiconductor device 100 along the sectional line II-II' in FIG. 1, in accordance with some embodiments.

As shown in FIGS. 2 and 3, in the semiconductor device 100, an isolation structure 103 and a plurality of S/D regions 105 are disposed in a semiconductor substrate 101. In particular, the S/D regions 105 are disposed in the active regions 104, which are defined by the isolation structure 103. The word lines 110 (i.e., gate structures) are disposed over the semiconductor substrate 101. Each of the word lines 110 includes a gate dielectric layer 107 and a gate electrode layer 109 over the gate dielectric layer 107. Mask layers 111 are disposed over the word lines 110, and spacers 113 are disposed over opposite sidewalls of the word lines 110 and the mask layers 111. An etch stop layer (ESL) 115 is disposed over the mask layers 111, the spacers 113 and the isolation structure 103, and a dielectric layer 117 is disposed over the etch stop layer 115.

Moreover, in the semiconductor device 100, the conductive plugs 119 are disposed between two adjacent word lines 110, and portions of the conductive plugs 119 extend over the word lines 110, as shown in FIGS. 2 and 3 in accordance with some embodiments. The semiconductor device 100 also includes the conductive cap layers 121 disposed over the conductive plugs 119, and an insulating layer 123 disposed over the dielectric layer 117 and the conductive cap layers 121. In particular, a sidewall 119S of the conductive plugs 119 is located over the word lines 110, a lower portion of the sidewall 119S is surrounded by the dielectric layer 117, and an upper portion of the sidewall 119S and top surfaces 119T of the conductive cap layers are covered by the conductive cap layers 121, in accordance with some embodiments.

In addition, in the semiconductor device 100, insulating layers 125, 127 and 129 (insulating layers 127 and 129 are shown in FIG. 3) are sequentially disposed over the insulating layer 123, and the bit lines 135 are disposed over the insulating layer 125. More specifically, conductive vias 133 are disposed between the bit lines 135 and the conductive cap layers 121 to provide electrical connections. The conductive vias 133 are surrounded by the insulating layers 123 and 125. In other words, the conductive vias 133 penetrate through the insulating layers 123 and 125. Moreover, the bit lines 135 penetrate through the insulating layers 127 and 129, and an interlayer dielectric (ILD) layer 137 is disposed over the bit lines 135 and the insulating layer 129.

Figure 4:
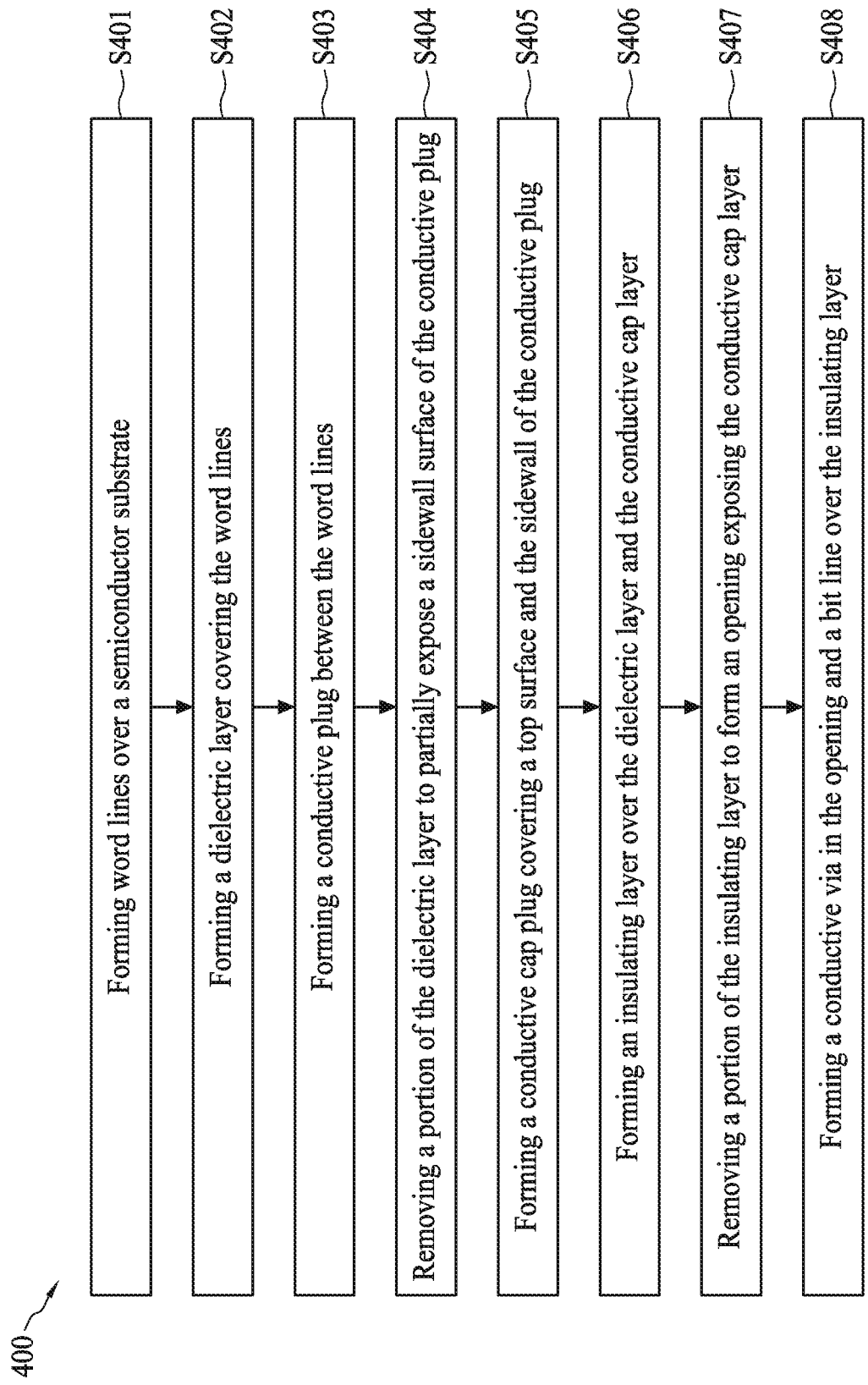
FIG. 4 is a flow diagram illustrating a method of forming the semiconductor device, in accordance with some embodiments.
Figure 5:
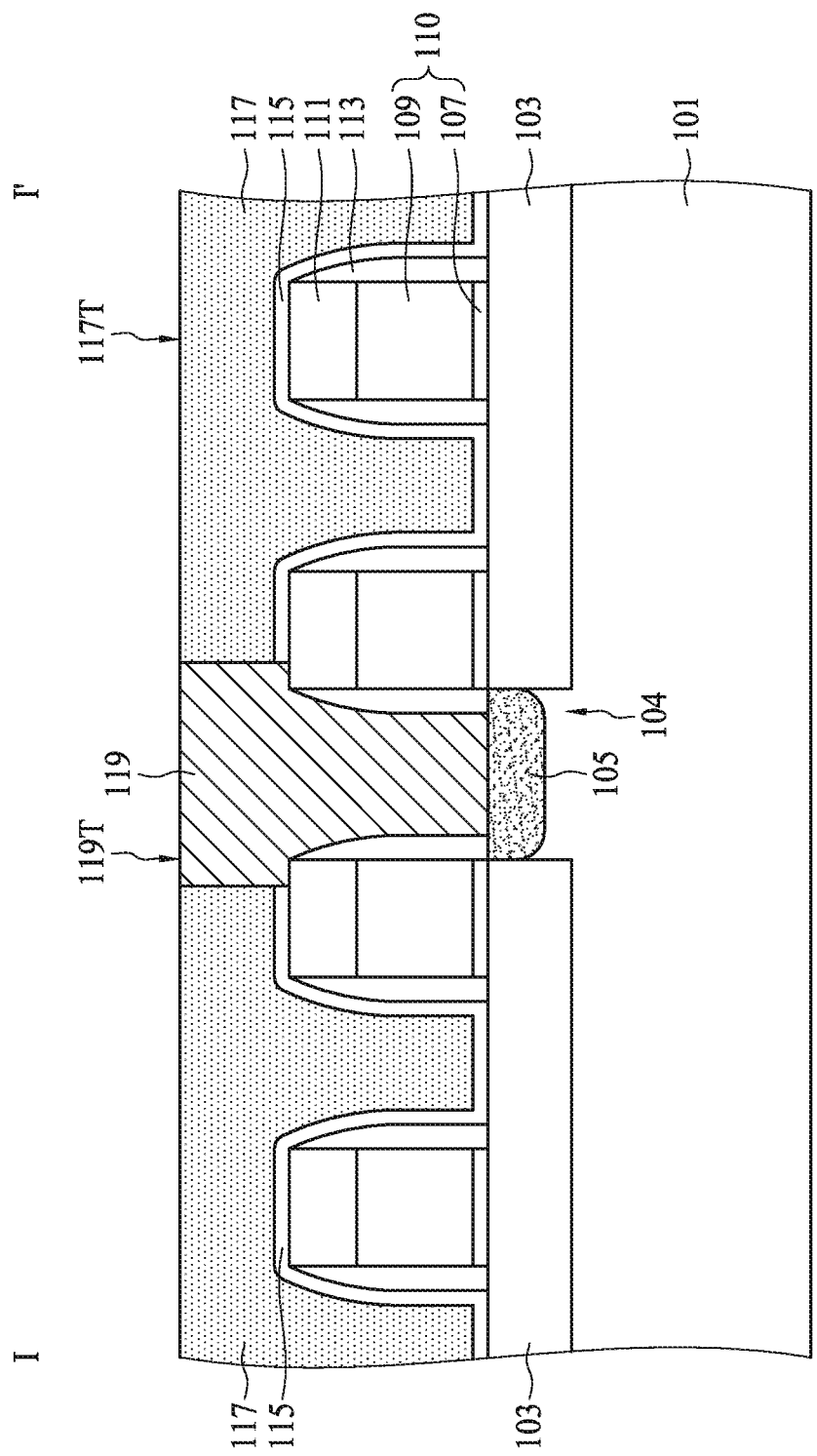
FIG. 5 is a cross-sectional view illustrating an intermediate stage in the formation of the semiconductor device along the sectional line I-I' in FIG. 1, in accordance with some embodiments.

FIG. 4 is a flow diagram illustrating a method 400 of forming the semiconductor device 100, and the method 400 includes steps S401, S402, S403, S404, S405, S406, S407 and S408, in accordance with some embodiments. FIG. 5 is a cross-sectional view illustrating an intermediate stage in the formation of the semiconductor device 100 along the sectional line I-I' in FIG. 1, and FIG. 6 is a cross-sectional view illustrating an intermediate stage in the formation of the semiconductor device 100 along the sectional line II-II' in FIG. 1, in accordance with some embodiments.

Figure 6:
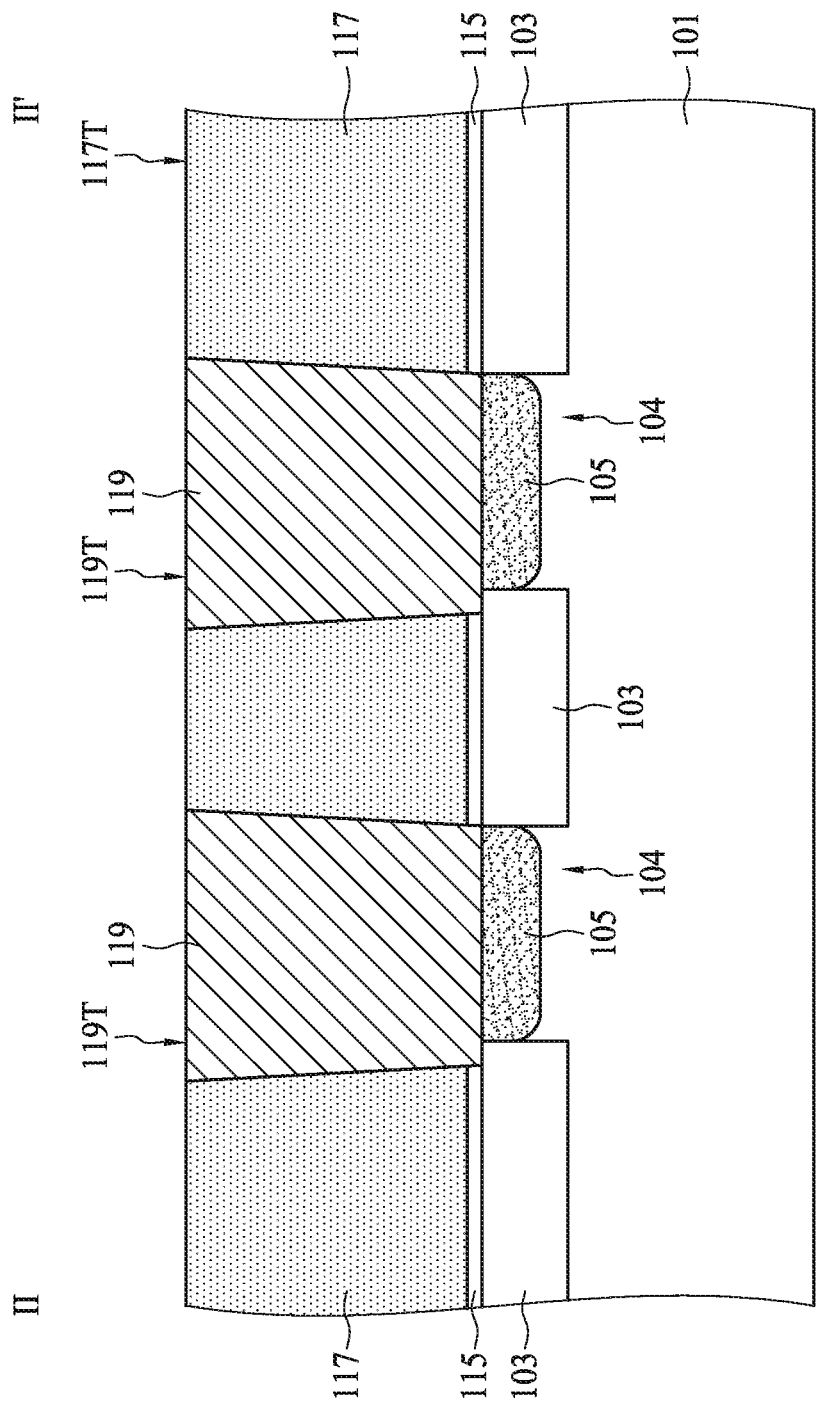
FIG. 6 is a cross-sectional view illustrating an intermediate stage in the formation of the semiconductor device along the sectional line II-II' in FIG. 1, in accordance with some embodiments.

As shown in FIGS. 5 and 6, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials and/or alloy semiconductor materials. Examples of the elementary semiconductor materials may include, but are not limited to, crystal silicon, polycrystalline silicon, amorphous silicon, germanium and/or diamond. Examples of the compound semiconductor materials may include, but are not limited to, silicon carbide, gallium arsenic, gallium phosphide, indium phosphide, indium arsenide and/or indium antimonide. Examples of the alloy semiconductor materials may include, but are not limited to, SiGe, GaAsP, AlInAs, AlGaAs, GaInAs, GaInP and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator (SOI) substrate which may include a substrate, a buried oxide layer over the substrate, and a semiconductor layer over the buried oxide layer.

Still referring to FIGS. 5 and 6, the isolation structure 103 is formed in the semiconductor substrate 101, and the isolation structure 103 is a shallow trench isolation (STI) structure, in accordance with some embodiments. In other embodiments, the isolation structure 103 is a local oxidation of silicon (LOCOS) structure (not shown). In these cases, a portion of the isolation structure 103 is embedded in the semiconductor substrate 101, and another portion of the isolation structure 103 protrudes from a top surface of the semiconductor substrate 101. The isolation structure 103 may be made of silicon oxide, silicon nitride, silicon oxynitride (SiON) or another applicable dielectric material.

Moreover, the isolation structure 103 defines the active regions 104 in the semiconductor substrate 101, and the S/D regions 105 are formed in the active regions 104. In some embodiments, the S/D regions 105 are formed by one or more ion implantation processes, and P-type dopants, such as boron (B), or N-type dopants, such as phosphorous (P) or arsenic (As), can be implanted in the active regions 104 to form the S/D regions 105.

Next, the word lines 110 (i.e., gate structures), including gate dielectric layers 107 and gate electrode layers 109, are formed over the semiconductor substrate 101. The respective step is illustrated as the step S401 in the method 400 shown in FIG. 4. Each of the gate dielectric layers 107 and the gate electrode layers 109 may be a single layer or multiple layers. In some embodiments, the gate dielectric layers 107 are made of silicon oxide, silicon nitride, silicon oxynitride (SiON), dielectric material(s) with high dielectric constant (high-k), or a combination thereof, and the gate electrode layers 109 are made of a conductive material such as aluminum (Al), copper (Cu), tungsten (W), titanium (Ti), tantalum (Ta), or another applicable material.

In some embodiments, the gate dielectric layers 107 and the gate electrode layers 109 are formed by deposition and patterning processes. The deposition process may include a chemical vapor deposition (CVD) process, a physical vapor deposition (PVD) process, a spin coating process, or another applicable process. The patterning process may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

After the word lines 110 are formed, the mask layers 111 are formed over top surfaces of the word lines 110, the spacers 113 are formed over sidewalls of the word lines 110 and sidewalls of the mask layers 111, and the ESL 115 is formed conformally covering the mask layers 111, the spacers 113, the isolation structures 103, and the active regions 104 (not shown in FIGS. 5 and 6, but described in detail below). The mask layers 111 are used as a mask for performing a self-aligned etching process to form conductive plugs electrically connected to the S/D regions 105. In some embodiments, the mask layers 111 are made of silicon oxide, silicon nitride, silicon carbonitride (SiCN), silicon oxide carbonitride (SiOCN) or SiLK.

In order to improve the speed of the semiconductor device 100, the spacers 113 are made of dielectric material(s) with low dielectric constant (low-k). In some embodiments, the low-k dielectric materials have a dielectric constant (k value) less than about 4. Examples of low-k dielectric materials include, but are not limited to, silicon oxide, silicon nitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide. In some other embodiments, the spacers 113 are made of extreme low-k (ELK) dielectric materials with a dielectric constant less than about 2.5.

In some embodiments, the ESL 115 is made of silicon nitride, silicon oxynitride, and/or other applicable materials. The mask layers 111, the spacers 113 and the ESL 115 may be formed by deposition processes and subsequent patterning processes. The details of the deposition processes and the patterning processes are similar to, or the same as, that of forming the word lines 110, and detailed descriptions thereof are not repeated herein.

Next, the dielectric layer 117 is formed conformally covering the ESL 115 and the word lines 110. The respective step is illustrated as the step S402 in the method 400 shown in FIG. 4. The dielectric layer 117 may be made of a dielectric material, such as silicon oxide, silicon nitride, silicon oxynitride, phosphosilicate glass (PSG), borophosphosilicate glass (BPSG), a low-k dielectric material, a combination thereof, or another applicable dielectric material. In addition, the dielectric layer 117 may be formed by CVD, PVD, atomic layer deposition (ALD), spin coating, or another applicable process.

More specifically, the ESL 115 and the dielectric layer 117 are formed conformally covering the mask layers 111, the spacers 113, the isolation structures 103, and the active regions 104. Next, the ESL 115 and the dielectric layer 117 are partially removed to expose the S/D regions 105, portions of the spacers 113, and portions of the mask layers 111 by an etching process, in accordance with some embodiments.

After the S/D regions 105 are exposed, the conductive plugs 119 are formed between the word lines 110 and in direct contact with the S/D regions 105, as shown in FIGS. 5 and 6 in accordance with some embodiments. The respective step is illustrated as the step S403 in the method 400 shown in FIG. 4.

In some embodiments, the conductive plugs 119 are made of a conductive material. For example, the conductive plugs 119 are made of a metal material such as copper (Cu). The conductive plugs 119 are formed by a deposition process and a planarization process. The deposition process may include a CVD process, and the planarization process may include a grinding process, a chemical mechanical polishing (CMP) process, an etching process, another applicable process, or a combination thereof. After the planarization process, the top surfaces 119T of the conductive plugs 119 are coplanar with the top surface 117T of the dielectric layer 117.

Figure 7:
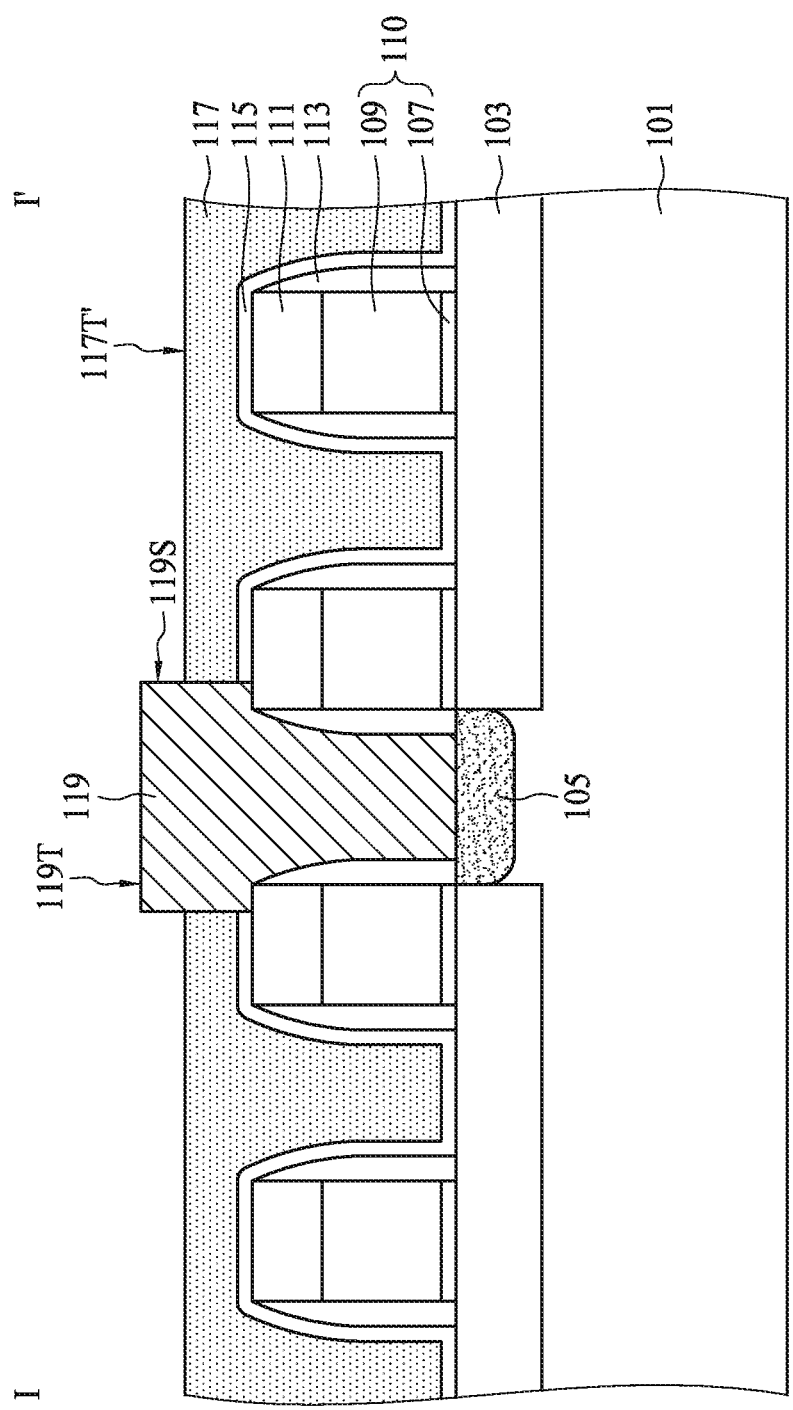
FIG. 7 is a cross-sectional view illustrating an intermediate stage in the formation of the semiconductor device along the sectional line I-I' in FIG. 1, in accordance with some embodiments.
Figure 8:
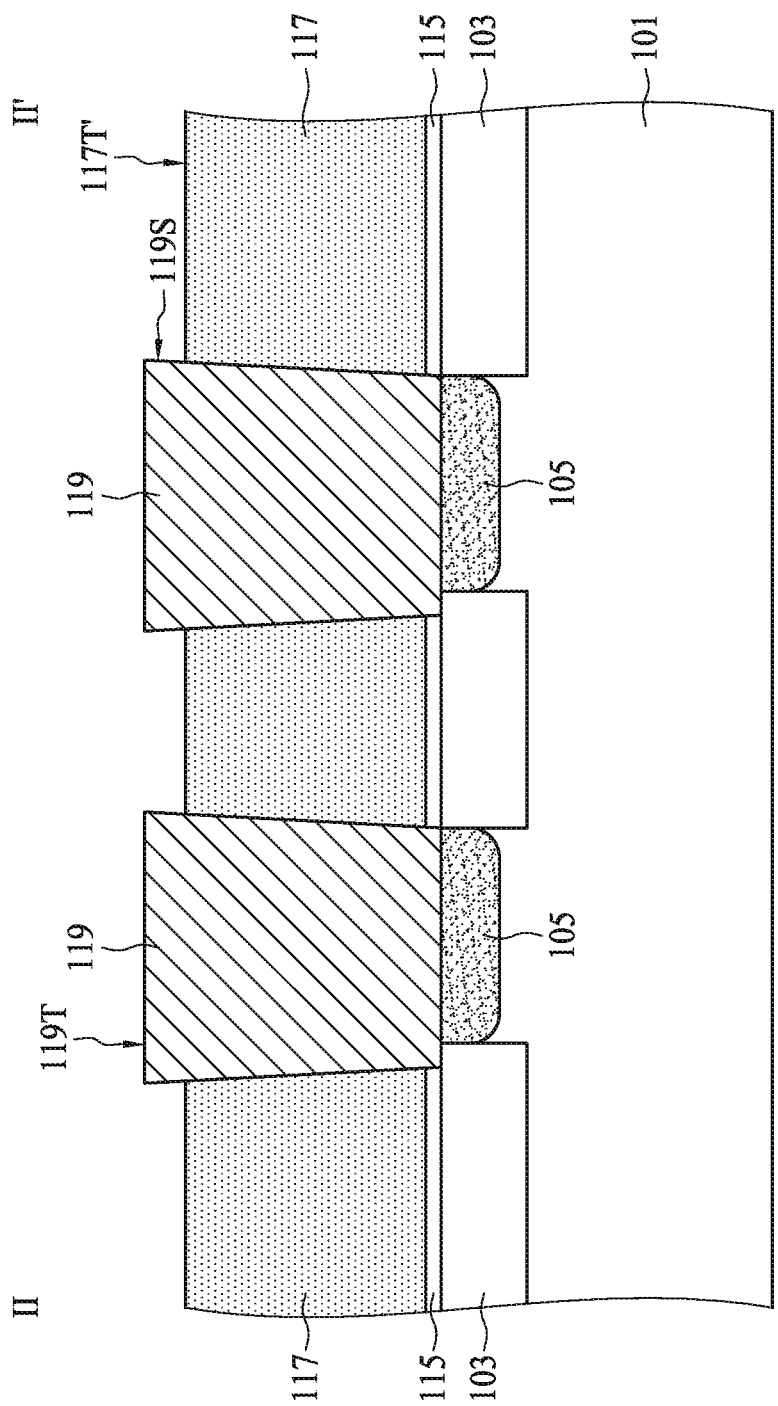
FIG. 8 is a cross-sectional view illustrating an intermediate stage in the formation of the semiconductor device along the sectional line II-II' in FIG. 1, in accordance with some embodiments.

After the conductive plugs 119 are formed, a portion of the dielectric layer 117 is removed to partially expose sidewalls 119S of the conductive plugs 119, as shown in FIGS. 7 and 8 in accordance with some embodiments. The respective step is illustrated as the step S404 in the method 400 shown in FIG. 4.

More specifically, a top portion of the dielectric layer 117 is removed by a dry etching process, and the conductive plugs 119 are substantially not etched, in accordance with some embodiments. Within the context of this disclosure, the word "substantially" means preferably at least 90%, more preferably 95%, even more preferably 98%, and most preferably 99%. As a result, the top surfaces 119T of the conductive plugs 119 are higher than an etched top surface 117T' of the dielectric layer 117.

Figure 9:
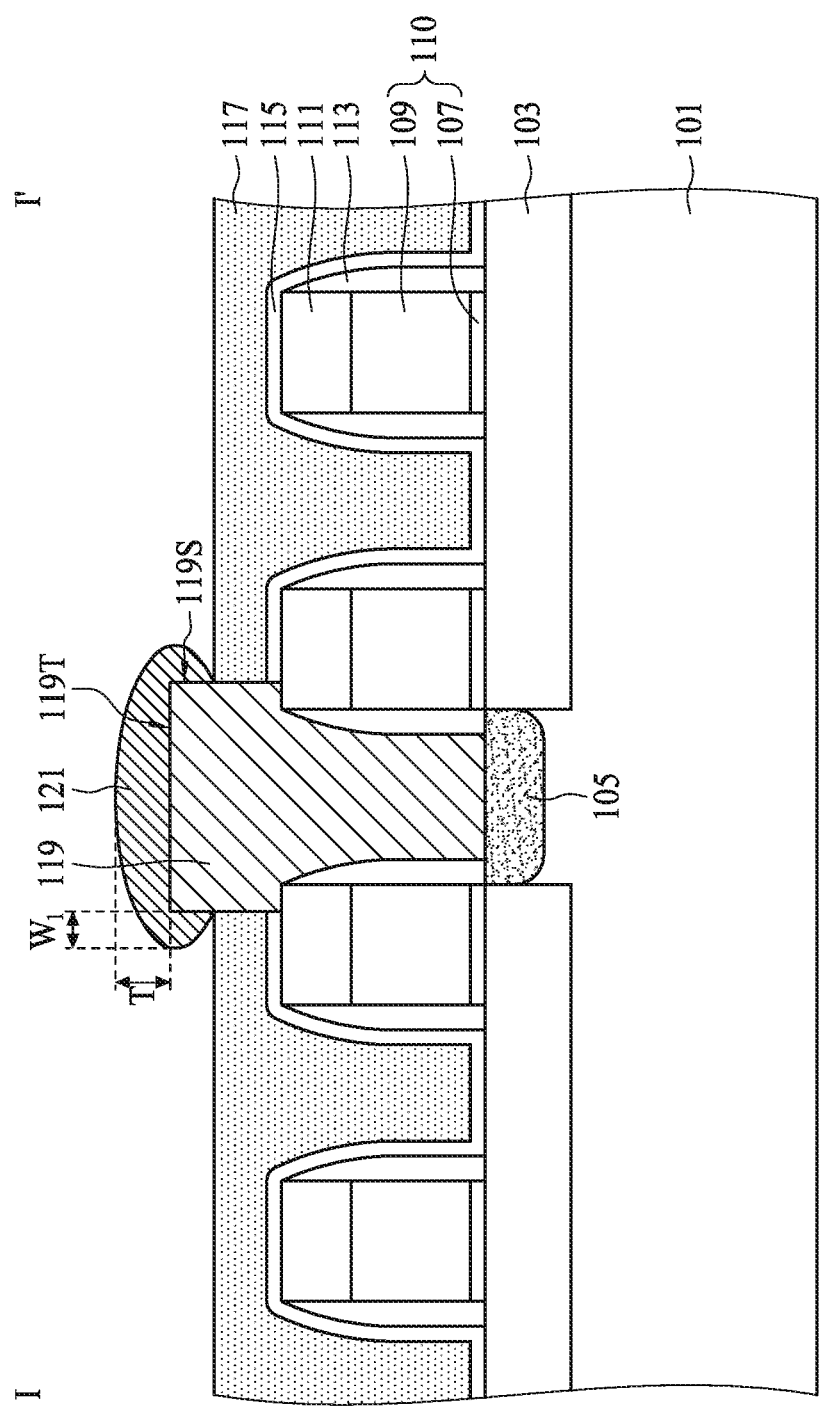
FIG. 9 is a cross-sectional view illustrating an intermediate stage in the formation of the semiconductor device along the sectional line I-I' in FIG. 1, in accordance with some embodiments.
Figure 10:
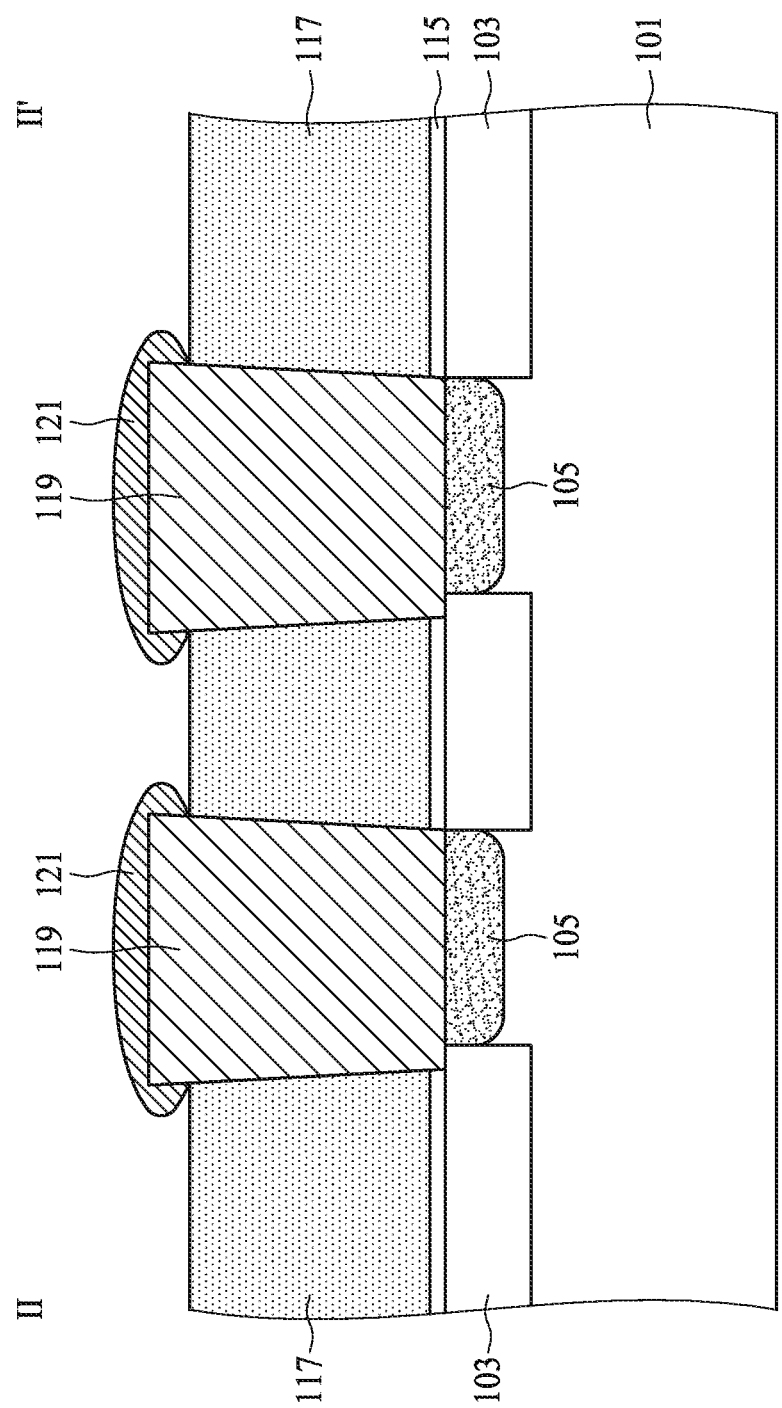
FIG. 10 is a cross-sectional view illustrating an intermediate stage in the formation of the semiconductor device along the sectional line II-II' in FIG. 1, in accordance with some embodiments.

After the upper portions of the sidewalls 119S are exposed by the removal of the portion of the dielectric layer 117, conductive cap layers 121 are formed covering the top surfaces 119T and the upper portions of the sidewalls 119S of the conductive plugs 119, as shown in FIGS. 9 and 10 in accordance with some embodiments. The respective step is illustrated as the step S405 in the method 400 shown in FIG. 4.

In some embodiments, the conductive cap layers 121 are formed by a CVD process, and a reactant gas used in the CVD process includes germane (GeH4). Since GeH4 is more likely to react with Cu than the materials of the dielectric layer 117, the conductive cap layers 121 including copper-germanium (Cu—Ge) alloy are formed entirely covering the top surfaces 119T and the upper portions of the sidewalls 119S of the conductive plugs 119, which are exposed by the removal of the portion of the dielectric layer 117. In some embodiments, the Cu—Ge alloy of the conductive cap layers 121 is $Cu_3Ge$. In addition, the conductive cap layers 121 are in direct contact with the dielectric layer 117, in accordance with some embodiments.

The portions of the conductive cap layers 121 over the top surfaces 119T of the conductive plugs 119 have a thickness T, and the portions of the conductive cap layers 121 over the sidewalls 119S of the conductive plugs 119 have a width $W_1$. In some embodiments, the thickness T and the width $W_1$ are in a range from about 2 nm to about 4 nm. If the thickness T and the width $W_1$ are too small (i.e., less than 2 nm), the issues of misalignment between the conductive plugs 119 and the conductive vias of the bit lines, which are formed over the conductive cap layers 121 during subsequent processes, may not be effectively prevented or reduced. If the thickness T and the width $W_1$ are too large (i.e., greater than 4 nm), the size of the semiconductor device 100 may be increased.

Figure 11:
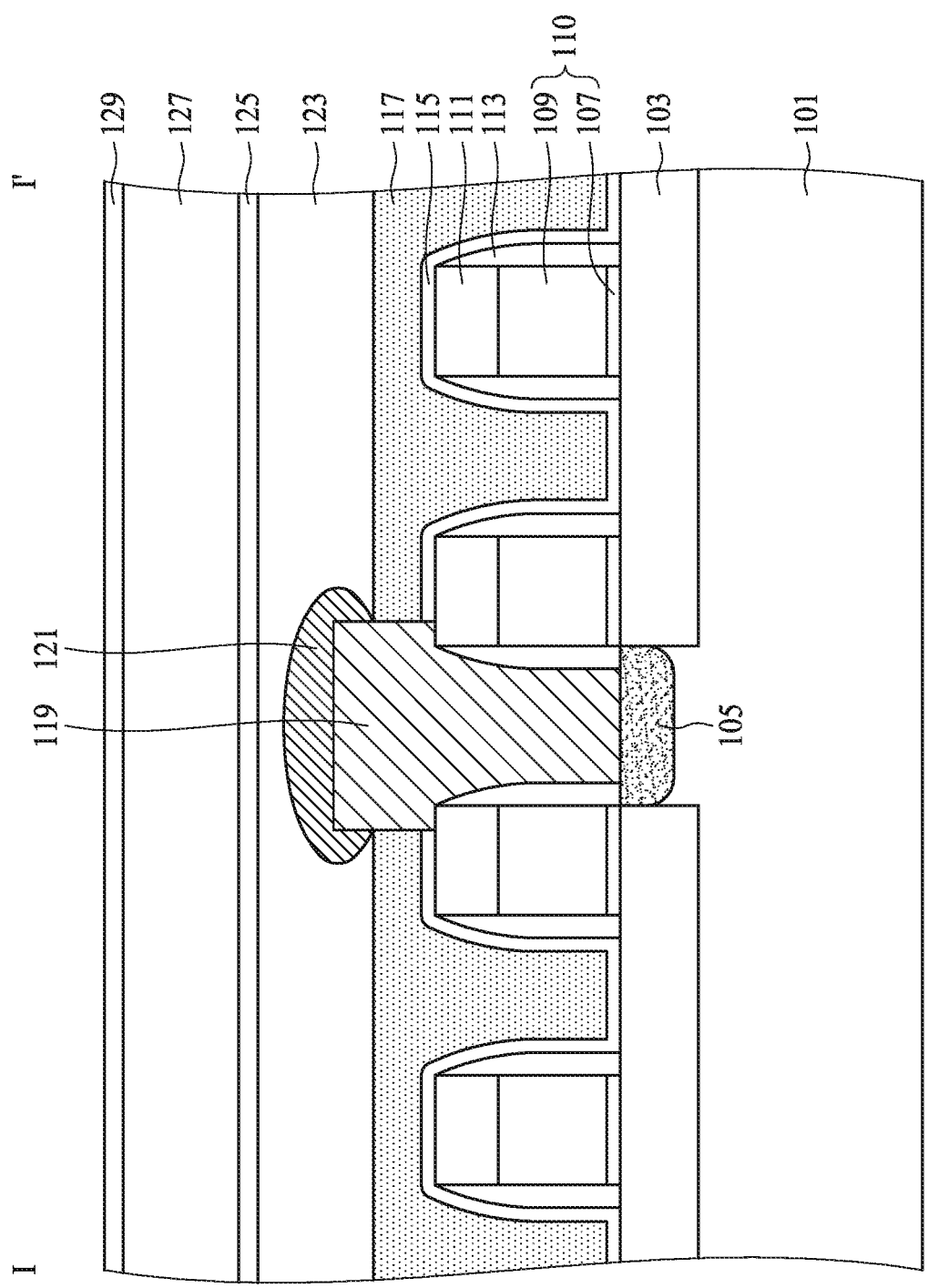
FIG. 11 is a cross-sectional view illustrating an intermediate stage in the formation of the semiconductor device along the sectional line I-I' in FIG. 1, in accordance with some embodiments.
Figure 12:
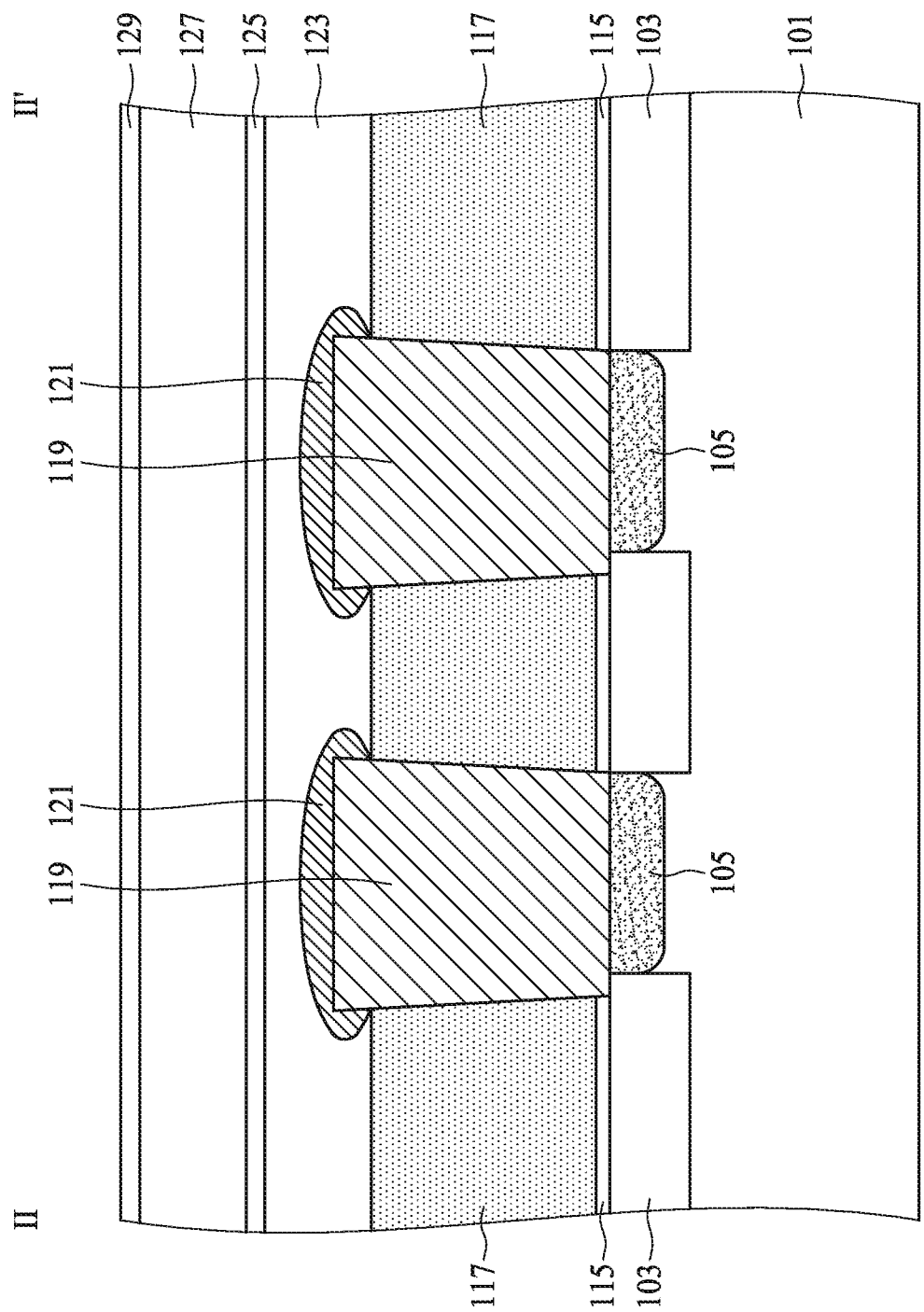
FIG. 12 is a cross-sectional view illustrating an intermediate stage in the formation of the semiconductor device along the sectional line II-II' in FIG. 1, in accordance with some embodiments.

After the conductive cap layers 121 are formed, the insulating layer 123 is formed over the dielectric layer 117 and the conductive cap layers 121, as shown in FIGS. 11 and 12 in accordance with some embodiments. The respective step is illustrated as the step S406 in the method 400 shown in FIG. 4. It should be noted that a portion of the insulating layer 123 extends between the conductive cap layers 121 and the dielectric layer 117. In other words, the portion of the insulating layer 123 is sandwiched between the conductive cap layers 121 and the dielectric layer 117.

Next, the insulating layers 125, 127 and 129 are sequentially formed over the insulating layer 123, in accordance with some embodiments. The insulating layers 123 and 127 may be made of oxide, silicon oxide, or another applicable insulating material, and the insulating layers 125 and 129 may be made of silicon nitride, or another applicable insulating material. The insulating layers 123, 125, 127 and 129 may be formed by deposition processes, such as CVD processes, PVD processes, or other applicable deposition processes. In some embodiments, the thickness of the insulating layer 123 and the thickness of the insulating layer 127 are greater than the thickness of the insulating layer 125 and the thickness of the insulating layer 129.

Figure 13:
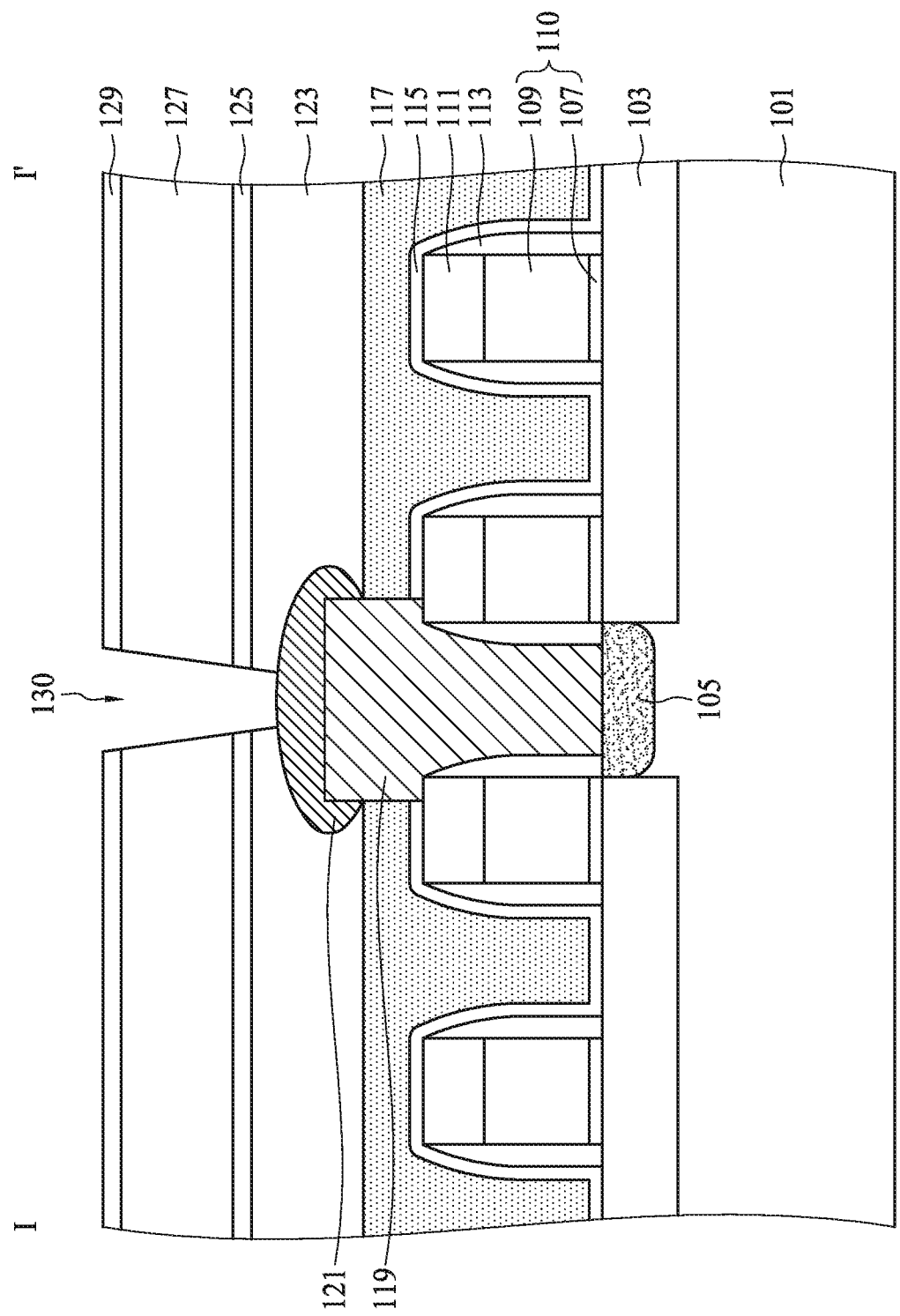
FIG. 13 is a cross-sectional view illustrating an intermediate stage in the formation of the semiconductor device along the sectional line I-I' in FIG. 1, in accordance with some embodiments.
Figure 14:
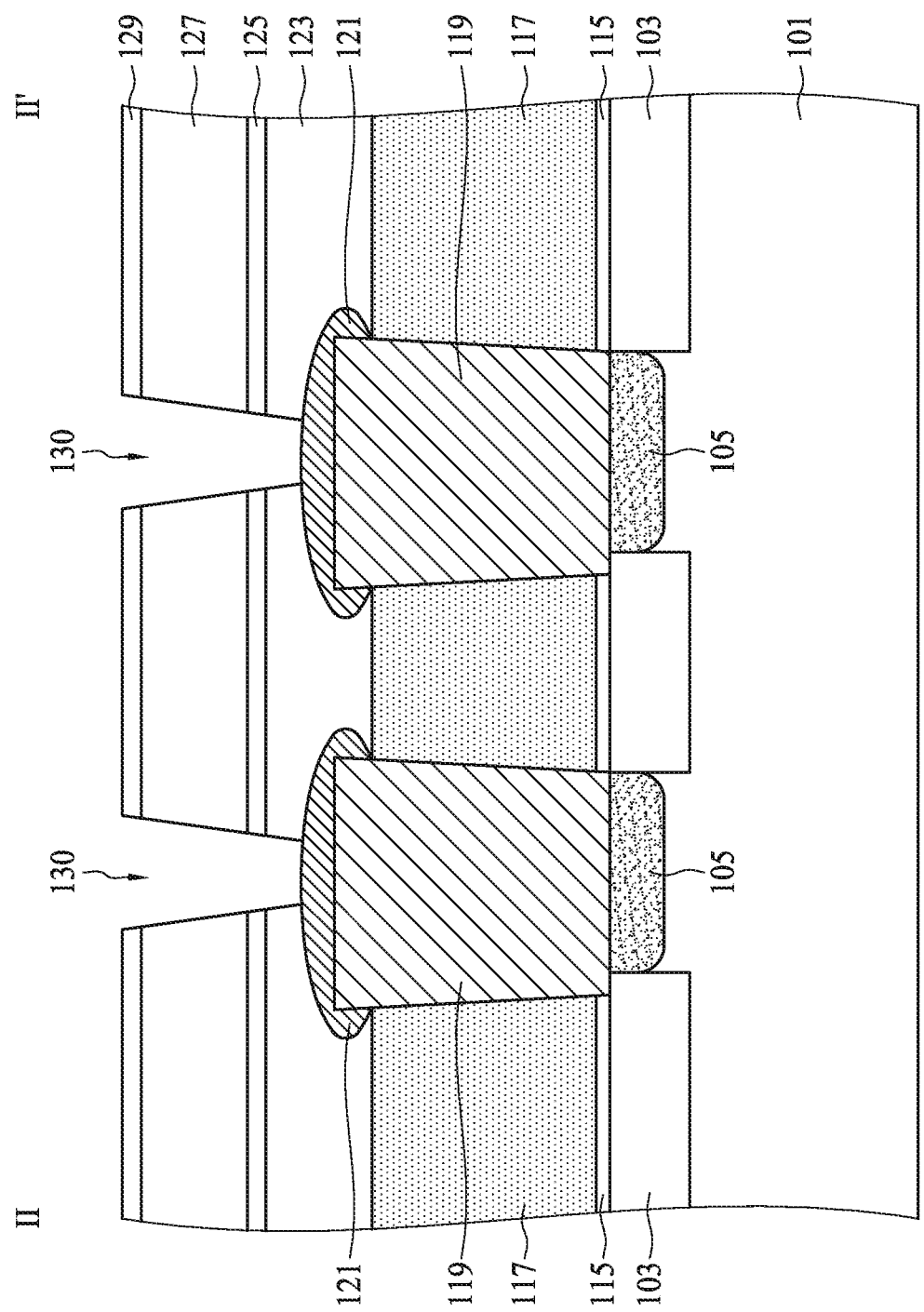
FIG. 14 is a cross-sectional view illustrating an intermediate stage in the formation of the semiconductor device along the sectional line II-II' in FIG. 1, in accordance with some embodiments.

Next, portions of the insulating layers 123, 125, 127 and 129 are removed to form openings 130 exposing the conductive cap layers 121, as shown in FIGS. 13 and 14 in accordance with some embodiments. The respective step is illustrated as the step S407 in the method 400 shown in FIG. 4. The openings 130 may be formed by a photolithography process and a subsequent etching process. For example, a patterned mask layer (not shown) is formed over the insulating layer 129, and then, portions of the insulating layers 123, 125, 127 and 129 are etched using the patterned mask layer as a mask. As a result, each of the conductive cap layers 121 has a portion exposed through the insulating layers 123, 125, 127 and 129. In some other embodiments, the openings 130 may be formed by more than one photolithography process and more than one etching process.

Figure 15:
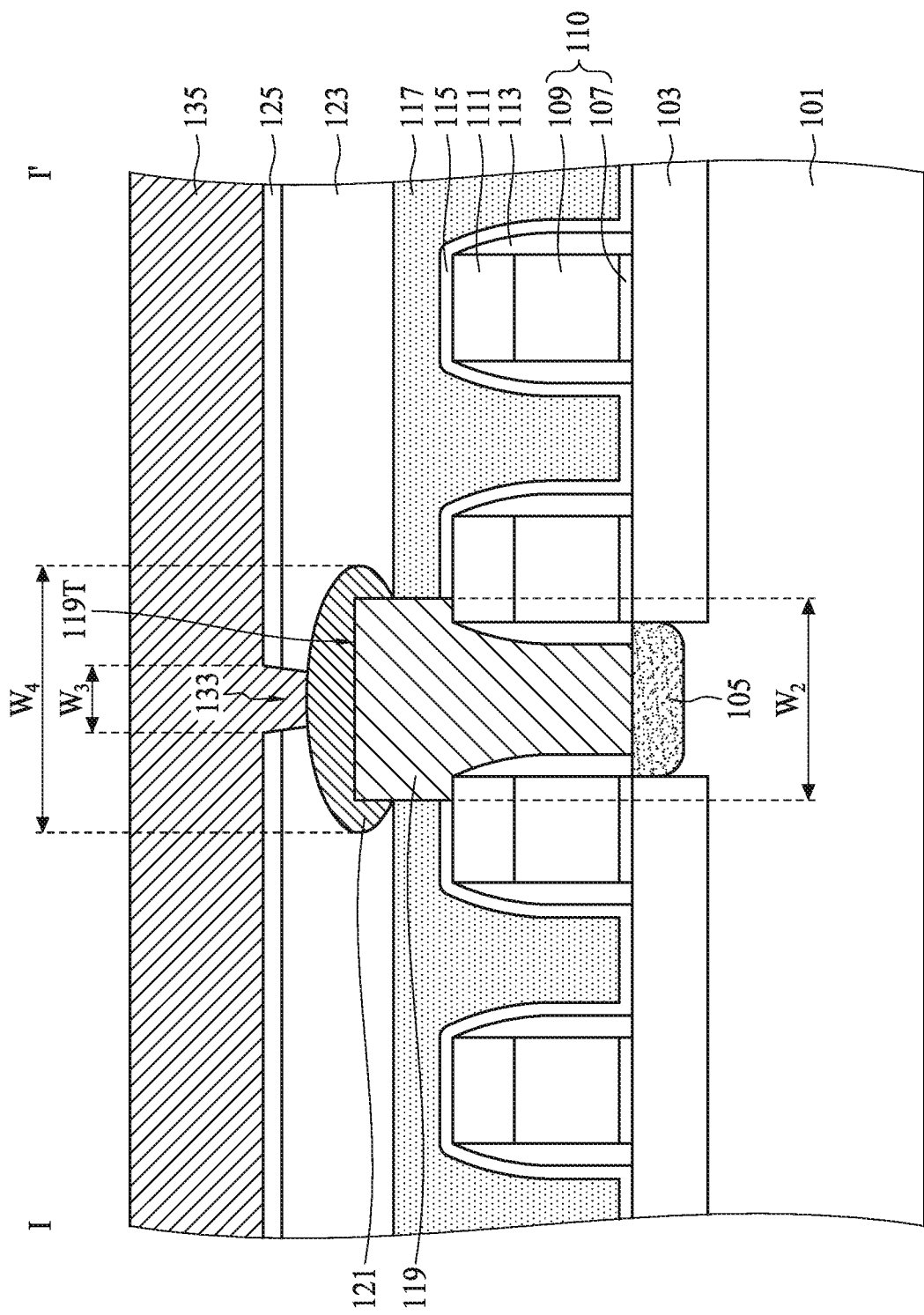
FIG. 15 is a cross-sectional view illustrating an intermediate stage in the formation of the semiconductor device along the sectional line I-I' in FIG. 1, in accordance with some embodiments.
Figure 16:
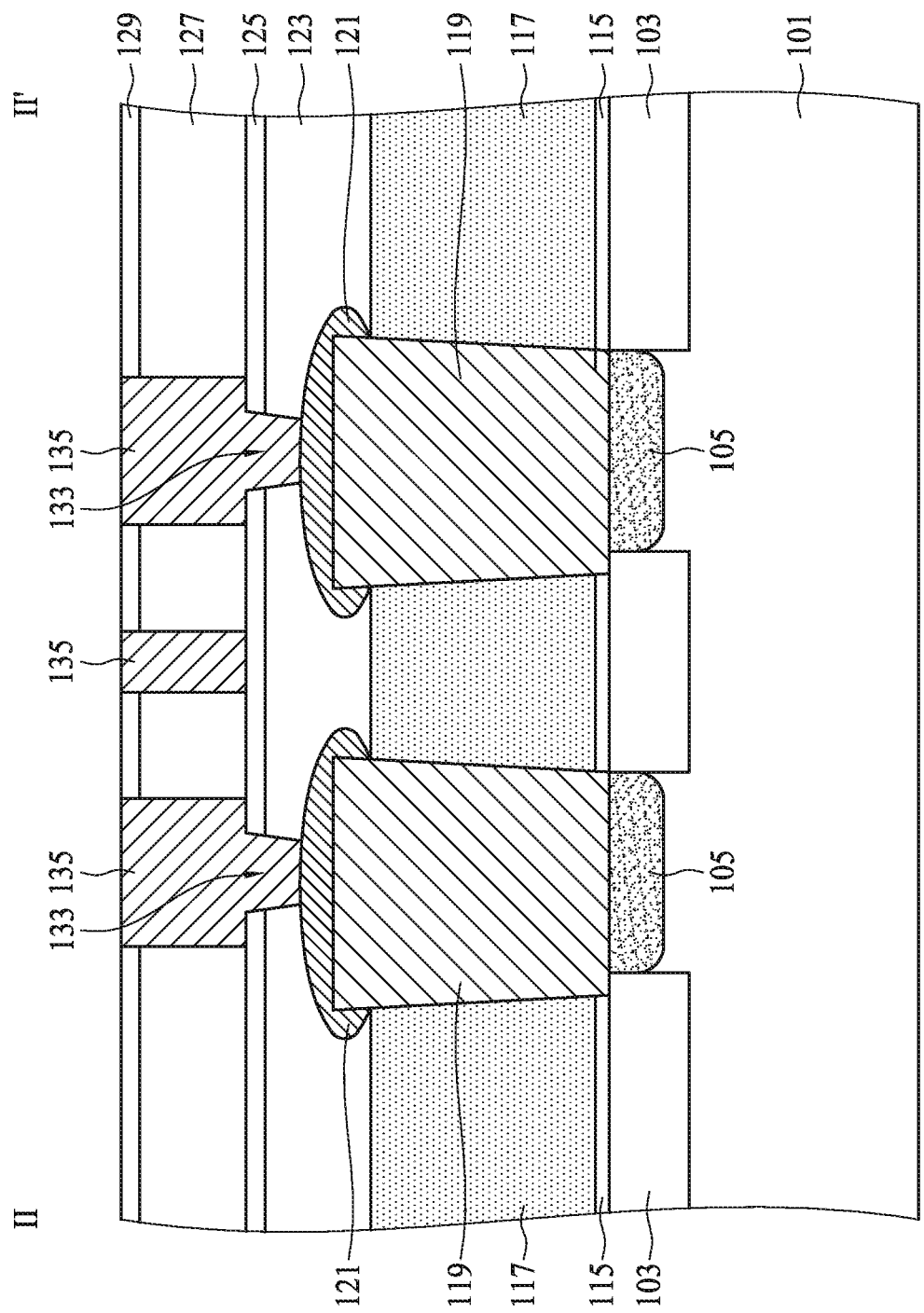
FIG. 16 is a cross-sectional view illustrating an intermediate stage in the formation of the semiconductor device along the sectional line II-II' in FIG. 1, in accordance with some embodiments.

Next, portions of the insulating layers 127 and 129 are removed to expand the upper portions of the openings 130, conductive vias 133 are formed in the remaining portions of the openings 130, the bit lines 135 are formed over the insulating layer 125, as shown in FIGS. 15 and 16 in accordance with some embodiments. The respective step is illustrated as the step S408 in the method 400 shown in FIG. 4.

More specifically, in some embodiments, the upper portions of the openings 130 are expanded by a photolithography process and a subsequent etching process. For example, a patterned mask layer (not shown) is formed over the insulating layer 129, and then, portions of the insulating layers 127 and 129 are etched using the patterned mask layer as a mask. The insulating layer 125 may serve as an etch stop layer during the etching process. As a result, portions of the top surface of the insulating layer 125 are exposed, and expanded openings are formed from the openings 130.

After the upper portions of the openings 130 are expanded, a conductive material is deposited over the insulating layer 129 and filled into the expanded openings 130, and a planarization process is performed to remove excess conductive material over the top surface of the insulating layer 129 such that the conductive vias 133 and the bit lines 135 over the conductive vias 133 are formed, in accordance with some embodiments. The bit lines 135 are electrically connected to the S/D regions 105 through the conductive vias 133, the conductive cap layers 121 and the conductive plugs 119, in accordance with some embodiments.

The conductive vias 133 and the bit lines 135 may be made of polysilicon, tungsten (W), titanium nitride (TiN), titanium silicide (TiSi), another applicable material, or a combination thereof, and may be formed by a deposition process, such as a CVD process. In some embodiments, since the conductive vias 133 and the bit lines 135 are formed by a deposition process, the materials of the conductive vias 133 and the materials of the bit lines 135 are the same. In other embodiments, the conductive vias 133 and the bit lines 135 are made of different materials and are formed respectively. The planarization process may include a grinding process, a CMP process, an etching process, another applicable process, or a combination thereof.

Referring to FIG. 15, the top surface 119T of the conductive plug 119 has a width $W_2$, the conductive cap layer 121 has a width $W_3$, and the conductive via 133 has a width $W_4$. It should be noted that, in some embodiments, the width $W_3$ is greater than the width $W_2$ and the width $W_4$. In addition, the width $W_2$ is greater than the width $W_4$, in accordance with some embodiments.

In some embodiments, the width $W_3$ of the conductive cap layer 121 is greater than the width $W_2$ of the conductive plug 119. Therefore, the area of the conductive plug 119 on which the conductive via 133 is to land (or be in direct contact with) may be increased by the formation of the conductive cap layer 121, and the issues of misalignment between the conductive plug 119 and the conductive via 133 may be prevented or reduced.

Next, an ILD layer 137 is formed over the bit lines 135 and the insulating layer 129, and the semiconductor device 100 is obtained, as shown in FIGS. 2 and 3 in accordance with some embodiments. The ILD layer 137 may include multilayers made of multiple dielectric materials, such as silicon oxide, silicon nitride, silicon oxynitride, PSG, BPSG, low-k dielectric material, and/or other applicable dielectric materials. In addition, the ILD layer 137 may be formed by CVD, PVD, ALD, spin coating, or another applicable process. After the ILD layer 137 is formed, the semiconductor device 100 is obtained.

It should be noted that the present disclosure is not limited to the semiconductor device 100 shown in FIG. 1 to FIG. 16. In other embodiments, the spacers 113 of the semiconductor device 100 have different configuration other than the spacers 113 shown in FIG. 2.

Figure 17:
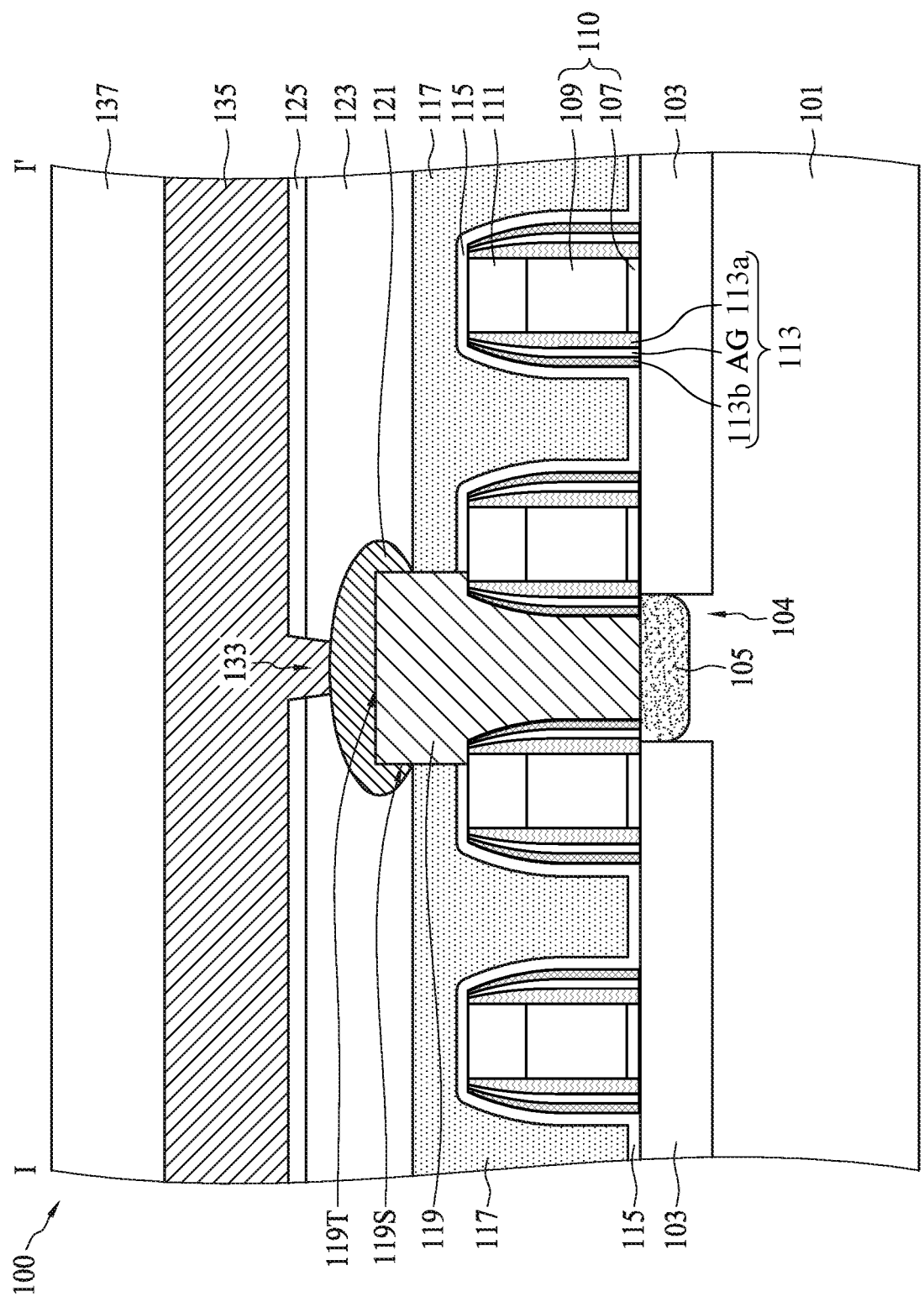
FIG. 17 is a cross-sectional view illustrating an intermediate stage in the formation of the semiconductor device along the sectional line I-I' in FIG. 1, in accordance with other embodiments.

Reference is made to FIG. 17. FIG. 17 is a cross-sectional view illustrating an intermediate stage in the formation of the semiconductor device 100 along the sectional line I-I' in FIG. 1, in accordance with other embodiments of the present disclosure.

As illustrated in FIG. 17, each of the spacers 113 includes an inner spacer 113a, an outer spacer 113b, and an air gap AG. The inner sider spacer 113a is in contact with a sidewall of the mask layer 111 and a sidewall of the word line 110. The air gap AG is sandwiched by the inner spacer 113a and the outer spacer 113b.

A bottom surface of the inner spacer 113a, a bottom surface of the air gap AG, and a bottom surface of the outer spacer 113b are coplanar to each other. A top surface of the inner spacer 113a, a top surface of the air gap AG, and a top surface of the outer spacer 113b are coplanar to each other. More particularly, the top surfaces of the inner spacer 113a, the outer spacer 113b, and the air gap AG are coplanar to a top surface of the mask layer 111.

The inner spacer 113a has a vertical sidewall and a curved sidewall opposite to the vertical sidewall. The vertical side is attached to the mask layer 111 and the word line 110, and the curved sidewall is in contact with the air gap AG.

Each of the air gap AG and the outer spacer 113b has a lower portion and an upper portion. The lower portion is substantially vertical to the semiconductor substrate 101, and the upper portion is tapered toward the mask layer 111.

In FIG. 17, the air gaps AP can be categorized into two groups. The first group of air gaps AP is in contact with the etch stop layer 115. Specifically, each of the first group of air gaps AP is enclosed by the inner spacer 113a, the outer spacer 113b, the etch stop layer 115, and the isolation structure 103. The second group of air gaps AP is in contact with the conductive plug 119. Specifically, each of the second group of air gaps AP is enclosed by the inner spacer 113a, the outer spacer 113b, the conductive plug 119, and the isolation structure 103.

In some embodiments, the method of forming the spacers 113 in FIG. 17 includes: forming the inner spacers 113a; forming sacrificial spacers in contact with the respective inner spacer 113a; forming the outer spacers 113b in contact with the respective sacrificial spacer; and removing the sacrificial spacers.

In some embodiments, the sacrificial spacers are formed of doped silicon oxide, whereas the inner spacers 113a and the outer spacers 113b are formed of a carbon-containing material. In addition, the carbon-containing material may include high density carbon (HDC), silicon carbide (SiC) or silicon carbonitride (SiCN). For instance, the inner spacers 113a may be formed of HDC, whereas the outer spacers 113b may be formed of HDC, SiC or SiCN. As compared to using silicon oxide for forming the sacrificial spacers and silicon nitride for forming the spacers 113a, 113b, forming the sacrificial spacers and the spacers 113a, 113b by the combination of the doped silicon oxide and the carbon-containing materials may result in better etching selectivity of the sacrificial spacer with respect to the spacers 113a, 113b. Therefore, the inner spacers 113a and the outer spacers 113b may remain substantially intact even after removal of the sacrificial spacers, and undesired electrical paths laterally extending to the gate electrode layer 107 from aside the word lines 110 can be effectively avoided.

In some embodiments, forming the inner spacers 113a includes: forming a material layer globally and conformally covering the isolation structure 103, the S/D regions 105, the sidewalls of the word lines 110, and the mask layers 111; and performing an anisotropic etching process on this material layer. During the anisotropic etching process, portions of the material layer covering top surfaces of the mask layers 111 as well as portions of the material layer extending along the top surface of the isolation structure 103 and the S/D regions 105 are removed, and portions of the material layer covering sidewalls of the word lines 110 and the mask layers 111 are shaped to form the inner spacers 113a. Subsequently, the sacrificial spacers and the outer spacers 113b are respectively formed by a similar method.

After the outer spacers 113b are formed, the sacrificial spacers are removed. The spaces previously occupied by the sacrificial spacers become the air gaps AG. It should be noted that, currently, the air gaps AG have not been sealed, and top ends of the air gaps AG may be communicated to outside. In some embodiments, a method for removing the sacrificial spacers includes an etching process, such as an isotropic etching process. In those embodiments where the sacrificial spacers are formed of the doped silicon oxide and the spacers 113a, 113b are each formed of the carbon-containing material, the etchant used for the etching process may include vapor hydrofluoric acid (VHF). The etchant used for the etching process may react with the sacrificial spacers from the top ends of the sacrificial spacers. Since the sacrificial spacers have sufficient etching selectivity with respect to the inner spacers 113a and the outer spacers 113b, the inner spacers 113a and the outer spacers 113b may remain substantially intact during the removal of the sacrificial spacers.

Embodiments of a semiconductor device and method for forming the same are provided. The semiconductor device includes a conductive cap layer disposed between a conductive plug and a bit line, and a top surface and a portion of a sidewall surface of the conductive plug are covered by the conductive cap layer. The semiconductor device also includes a conductive via disposed between the conductive cap layer and the bit line. The width of the conductive cap layer is greater than the width of the conductive plug. Therefore, the area of the conductive plug on which the conductive via is to land (or be in direct contact with) may be increased by the formation of the conductive cap layer. As a result, the issues of misalignment between the conductive plug and the conductive via may be prevented or reduced.

In one embodiment of the present disclosure, a semiconductor device is provided. The semiconductor device includes a semiconductor substrate, word lines, mask layers, spacers, a conductive plug, a conductive cap layer, and a dielectric layer. The word lines are disposed over the semiconductor substrate. The mask layers are disposed over the plurality of word line, respectively. The spacers are disposed over opposite sidewalls of the word lines and opposite sidewalls of the mask layers, respectively. The conductive plug is disposed between the word lines. The conductive cap layer is disposed over the conductive plug. The dielectric layer is disposed over the word lines and the spacers. Each of the spacers includes an inner spacer, an outer spacer, and an air gap. The inner spacer is in contact with the respective word line and the respective mask layer. The air gap is disposed between the inner spacer and the outer spacer.

In one embodiment of the present disclosure, a method for forming a semiconductor device is provided. The method includes: forming word lines over a semiconductor substrate; forming mask layers over the word lines, respectively; forming spacers over opposite sidewalls of the word lines and opposite sidewalls of the mask layers, respectively; forming a dielectric layer covering the word lines; forming a conductive plug between the word lines, wherein the conductive plug is surrounded by the dielectric layer; removing a portion of the dielectric layer to partially expose a sidewall surface of the conductive plug; and forming a conductive cap layer covering a top surface and the sidewall surface of the conductive plug. The step of forming the spacers includes: forming inner spacers in contact with the word lines; forming sacrificial spacers in contact with the inner spacers, respectively; forming outer spacers in contact with the sacrificial spacers, respectively; and removing the sacrificial spacers.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A semiconductor device, comprising:
a semiconductor substrate;
a plurality of word lines disposed over the semiconductor substrate;
a plurality of mask layers disposed over the plurality of word lines, respectively;
a plurality of spacers disposed over opposite sidewalls of the plurality of word lines and opposite sidewalls of the plurality of mask layers, respectively;
a conductive plug having an elongated first portion upwardly extended from the semiconductor substrate and disposed between two of the word lines, and an enlarged second portion upwardly extended from the elongated first portion and positioned above the word lines, wherein a width of the elongated first portion is less than a width of the enlarged second portion;

a conductive cap layer disposed over the conductive plug; and a dielectric layer disposed on the semiconductor substrate to cover the plurality of word lines and the plurality of spacers, wherein the dielectric layer has a height larger than a height of the word lines and the spacers, such that the word lines and the spacers are enclosed within the dielectric layer;

wherein the elongated first portion of the conductive plug is upwardly extended from the semiconductor substrate at a position below a top surface of the dielectric layer while the enlarged second portion of the conductive plug is upwardly extended through the top surface of the dielectric layer;

wherein each of the plurality of spacers comprises:

an inner spacer in contact with the respective word line and the respective mask layer;

an outer spacer; and an air gap, disposed between the inner spacer and the outer spacer;

wherein at least one of the air gaps is enclosed by the semiconductor substrate, the inner spacer, the outer spacer, and the conductive plug, such that a top surface of at least one of the air gaps is enclosed by the enlarged second portion of the conductive plug.

2. The semiconductor device of claim 1, further comprising:

an etch stop layer, disposed over the plurality of mask layers, the plurality of spacers, and the semiconductor substrate, wherein the dielectric layer is disposed over the etch stop layer, such that the etch stop layer is enclosed by the dielectric layer, wherein at least one of the air gaps is enclosed by the semiconductor substrate, the inner spacer, the outer spacer, and the etch stop layer, wherein the etch stop layer is sandwiched between the outer spacer and the dielectric layer.

3. The semiconductor device of claim 2, wherein the etch stop layer is in contact with the air gap, such that a top surface of at least one of the air gap is enclosed by the etch stop layer, wherein the etch stop layer is extended along an outer surface of the outer spacer to enclose the top surface of at least one of the air gaps.

4. The semiconductor device of claim 1, wherein the inner spacer comprises a vertical sidewall and a curved sidewall, wherein the vertical sidewall is in contact with the respective word line, and the curved sidewall is in contact with the air gap, wherein each of the air gaps has a lower portion extended vertically to the semiconductor substrate and an upper portion tapered toward the mask layer, such that the lower portion of each of the air gaps has a uniform width while a width of the upper portion of each of the air gaps is gradually reduced toward the mask layer.

5. The semiconductor device of claim 1, wherein the outer spacer comprises a lower portion and an upper portion, wherein the lower portion is substantially vertical to the semiconductor substrate, and the upper portion is tapered toward the respective word line.

6. The semiconductor device of claim 1, wherein a top surface of the plurality of spacers is coplanar with a top surface of the plurality of mask layers.

7. The semiconductor device of claim 1, further comprising:

a plurality of isolation structures disposed in the semiconductor substrate, wherein a bottom surface of at least one of the air gaps is enclosed by the isolation structure; and a source/drain (S/D) region disposed in the semiconductor substrate and between the plurality of isolation structures.

8. The semiconductor device of claim 7, wherein the conductive plug is in contact with the S/D region.

9. The semiconductor device of claim 8, further comprising:

a bit line disposed over the conductive cap layer, wherein the bit line is electrically coupled to the S/D region through the conductive cap layer and the conductive plug.

10. The semiconductor device of claim 9, further comprising:

a conductive via disposed between the bit line and the conductive cap layer, wherein a width of the conductive cap layer is greater than a width of the conductive via, and the bit line is electrically connected to the conductive cap layer through the conductive via.

11. The semiconductor device of claim 9, further comprising:

an interlayer dielectric (ILD) layer disposed over the bit line.

12. The semiconductor device of claim 1, wherein the enlarged second portion of the conductive plug has an upper part above the top surface of the dielectric layer and a lower part below the top surface of the dielectric layer, wherein a top surface of the upper part of the enlarged second portion of the conductive plug and a portion of a sidewall of the upper part of the enlarged second portion of the conductive plug are covered by the conductive cap layer, wherein at least one of the air gaps is enclosed by the semiconductor substrate, the inner spacer, the outer spacer, and a bottom of the lower part of the enlarged second portion of the conductive plug.

13. The semiconductor device of claim 12, wherein the upper part of the enlarged second portion of the sidewall of the conductive plug protrudes from the dielectric layer, wherein the top surface of the conductive plug is higher than the top surface of the dielectric layer.

14. The semiconductor device of claim 1, wherein the conductive plug comprises copper.

15. The semiconductor device of claim 1, wherein the conductive cap layer comprises copper-germanium alloy.

16. The semiconductor device of claim 15, wherein the copper-germanium alloy is $Cu_3Ge$.

17. The semiconductor device of claim 1, wherein the conductive cap layer is in direct contact with the dielectric layer and is exposed above the dielectric layer.

18. The semiconductor device of claim 1, further comprising:

a first insulating layer disposed over the dielectric layer and in contact with the conductive cap layer, wherein the conductive cap layer is enclosed within the first insulating layer; and a second insulating layer disposed over the first insulating layer.

19. The semiconductor device of claim 18, wherein a thickness of the first insulating layer is greater than a thickness of the second insulating layer.

20. The semiconductor device of claim 1, wherein the inner spacer and the outer spacer comprise carbon-containing material.

* * * * *